(12) United States Patent
Sasaki

(10) Patent No.: US 7,868,409 B2
(45) Date of Patent: Jan. 11, 2011

(54) SEMICONDUCTOR INTEGRATED CIRCUIT WITH SOLDER BUMP

(75) Inventor: Takao Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 130 days.

(21) Appl. No.: 12/034,997

(22) Filed: Feb. 21, 2008

(65) Prior Publication Data
US 2008/0290475 A1 Nov. 27, 2008

(30) Foreign Application Priority Data
Feb. 21, 2007 (JP) ............... 2007-041515

(51) Int. Cl.
H01L 23/58 (2006.01)
(52) U.S. Cl. ............ 257/491; 257/678; 257/686; 257/691; 257/728; 257/777; 436/106; 436/109
(58) Field of Classification Search ........ 257/491, 257/E23.006, E21.508
See application file for complete search history.

(56) References Cited

U.S. PATENT DOCUMENTS 5,726,492 A * 3/1998 Suzuki et al. ............ 257/685
7,279,728 B2 10/2007 Itakura et al.
2004/0266160 A1 * 12/2004 Jao et al. .................... 438/613
2005/0014476 A1 * 1/2005 Oono et al. ................. 455/118
2006/0180928 A1 * 8/2006 Takahira .................... 257/737
2006/0245308 A1 * 11/2006 Macropoulos et al. ......... 369/1

FOREIGN PATENT DOCUMENTS

JP 2004-350117 12/2004
JP 2006-012990 1/2006

* cited by examiner

Primary Examiner—N Drew Richards
Assistant Examiner—Kyoung Lee
(74) Attorney, Agent, or Firm—Staas & Halsey LLP

(57) ABSTRACT

A semiconductor integrated circuit which is connected to a substrate by solder bumps wherein, when at least one solder bump is connected to a signal line of the semiconductor integrated circuit and the semiconductor integrated circuit is mounted on the substrate, the semiconductor integrated circuit is bonded to the substrate by the solder bump, and the interconnection to the substrate is made by dummy bumps forming wires at the substrate side.

9 Claims, 8 Drawing Sheets

Related Art   FIG. 8
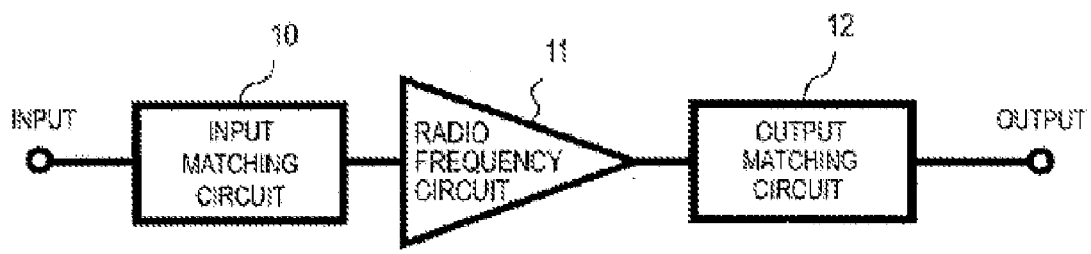
Related Art   FIG. 9
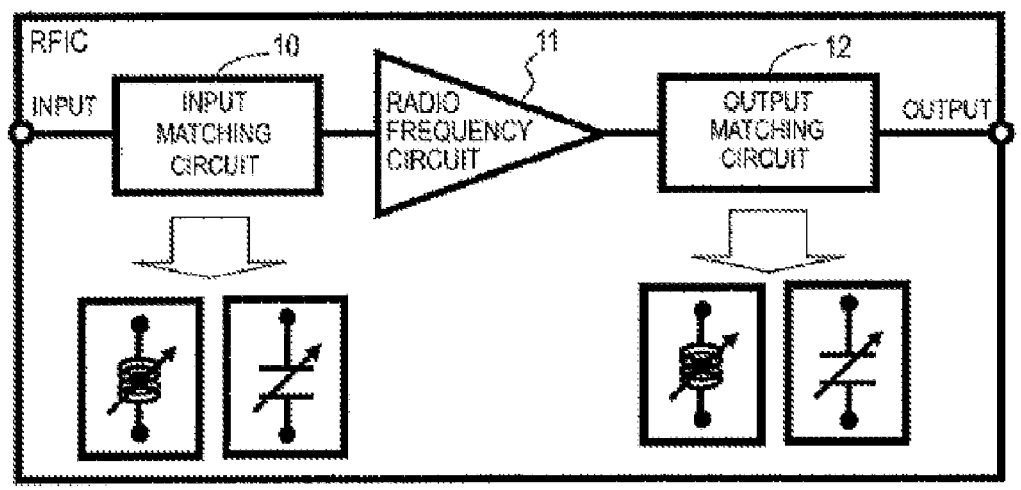
Related Art   FIG. 10
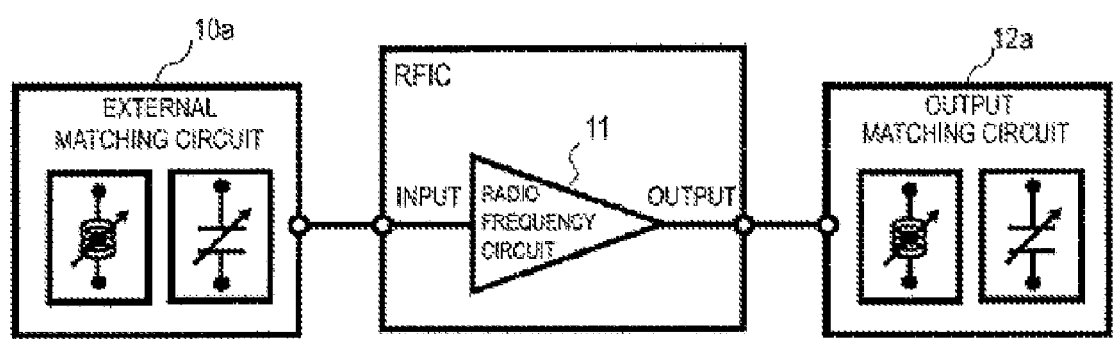

Related Art   FIG. 11A
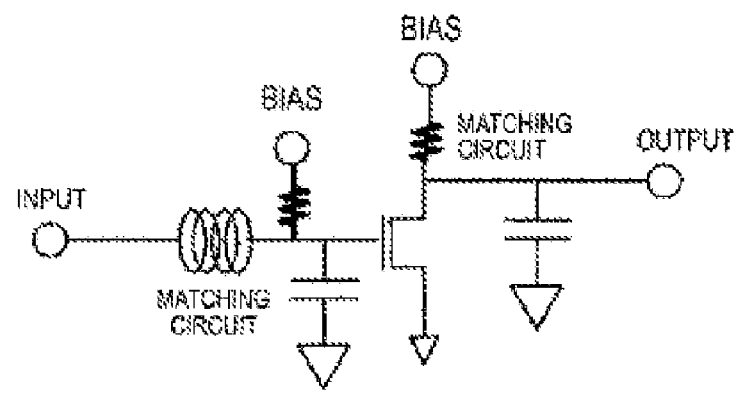
Related Art   FIG. 11B
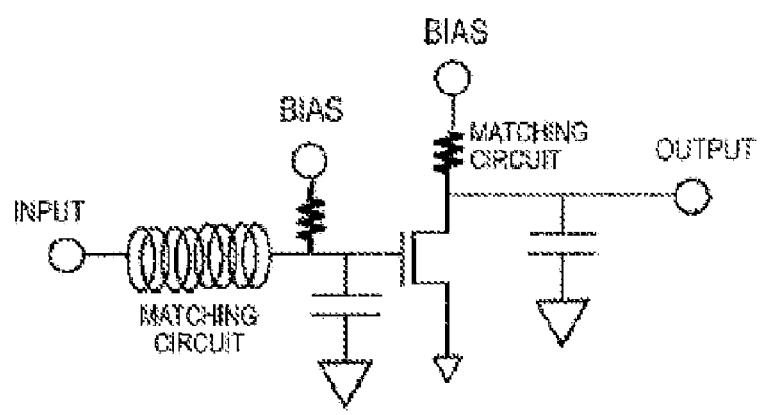
Related Art   FIG. 11C
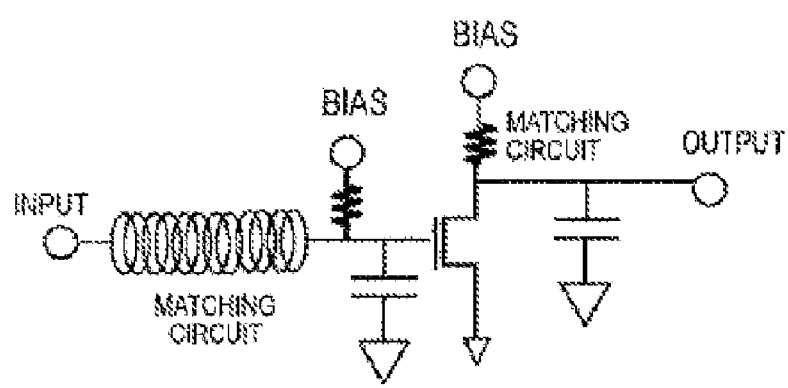

SEMICONDUCTOR INTEGRATED CIRCUIT WITH SOLDER BUMP

BACKGROUND OF THE INVENTION

1. Field of the Invention

The present invention relates to a semiconductor integrated circuit.

2. Description of the Related Art

A variety of wireless systems such as cellular phones and wireless LAN has been developed in recent years. Multiple frequency bands have been provided to increase channel capacity, even with the same radio system, and because of national circumstances. An apparatus for providing service to such multiple frequency bands must have a radio frequency integrated circuit (RFIC) for supporting each frequency band. Either a frequency band tuning circuit or multiple high frequency circuits are required to realize a radio frequency integrated circuit for supporting each frequency band. In this way, a single chip can be given the ability to use multiple frequency band circuits by having either a circuit for tuning multiple frequency bands or multiple high frequency circuits and connecting only to the circuit that is appropriate for the frequency band being used. The size of a single chip, however, will increase in cases such as this. Passive circuits comprising capacitors and inductors occupy an especially large area compared to circuits comprising elements such as transistors inside an IC chip. Frequency band tuning circuits include capacitors or inductors, so if multiple frequency band tuning circuits are provided in an IC chip, the chip size will be greater than would be the case so that multiple elements such as transistors were provided.

FIGS. 8, 9, 10, 11A, 11B, and 11C show the problems of conventional art.

FIG. 8 shows the configuration of a typical high frequency circuit. FIG. 9 shows the first configuration of a conventional RFIC which can support broadband. FIG. 10 shows the second configuration of a conventional RFIC which can support broadband. FIGS. 11A, 11B, and 11C show three configurations of a conventional RFIC which can support broadband.

As shown in FIG. 8, a high frequency circuit 11 provides an input matching circuit 10 and an output matching circuit 12 for tuning to the desired frequency band. Because matching circuits have specific frequency characteristics (filter characteristics), they cannot realize broadband frequency circuits which cover multiple frequency bands with a single matching circuit.

As shown in FIG. 9, variable capacitors or variable inductors may be provided between the input matching circuit 10 and the output matching circuit 12 to produce a broadband RFIC, which includes high frequency circuits. In this circuit, variable capacitors or variable inductors are used to make the operating frequency of matching circuits variable. However, passive components such as capacitors or inductors increase the area of RFICs more than any other elements in an IC.

Also, as described in Japanese Unexamined Patent Application Publication No. 2004-350117 or Japanese Unexamined Patent Application Publication No. 2006-12990, there are cases where transistor switches are used to make inductors or capacitors variable. However, because the ON resistance of transistors is several tens of ohms, significant degradation of performance characteristics may occur in high frequency circuits. It is also difficult to actually apply the transistors RFICs which handle high frequency signals can not realize a variable matching circuit in this way.

Also, as shown in FIG. 10, there is a method whereby only the high frequency circuit 11 is provided in an RFIC. An outside RFIC comprises external matching circuits 10a and 12a as discrete components. The external matching circuits 10a and 12a are connected to the RFIC by wires. Also, if variable matching circuits 10a and 12a are provided outside the RFIC, an IC comprised of variable capacitors or variable inductors will be configured as discrete components with a large area. Therefore, the resulting IC becomes larger, which has more components, which becomes more expensive, and which has a larger circuit size.

Furthermore, as shown in FIGS. 11A, 11B, and 11C, when a single IC provides multiple high frequency circuits to cover each frequency band, the number of circuits increases. The RFIC area, in particular, increases due to active components such as inductors or capacitors that are used in matching circuits.

SUMMARY OF THE INVENTION

Therefore, an object of the present apparatus is to simplify the circuit configuration of a semiconductor integrated circuit using multiple frequency bands. In order to achieve the above object, a semiconductor integrated circuit is connected to a substrate by solder bumps wherein, when at least one solder bump is connected to a signal line of the semiconductor integrated circuit and the semiconductor integrated circuit is mounted on the substrate, the semiconductor integrated circuit is bonded to the substrate by the solder bump, and the interconnection to the substrate is made by dummy bumps forming wires at the substrate side.

The above-described embodiments of the present invention are intended as examples, and all embodiments of the present invention are not limited to including the features described above.

BRIEF DESCRIPTION OF THE DRAWINGS

FIG. 8 shows problems with conventional technology (part 1).

FIG. 9 shows problems with conventional technology (part 2).

FIG. 10 shows problems with conventional technology (part 3).

FIGS. 11A, 11B, and 11C show problems with conventional technology (part 4).

DETAILED DESCRIPTION OF THE PREFERRED EMBODIMENTS

Figure 1A:
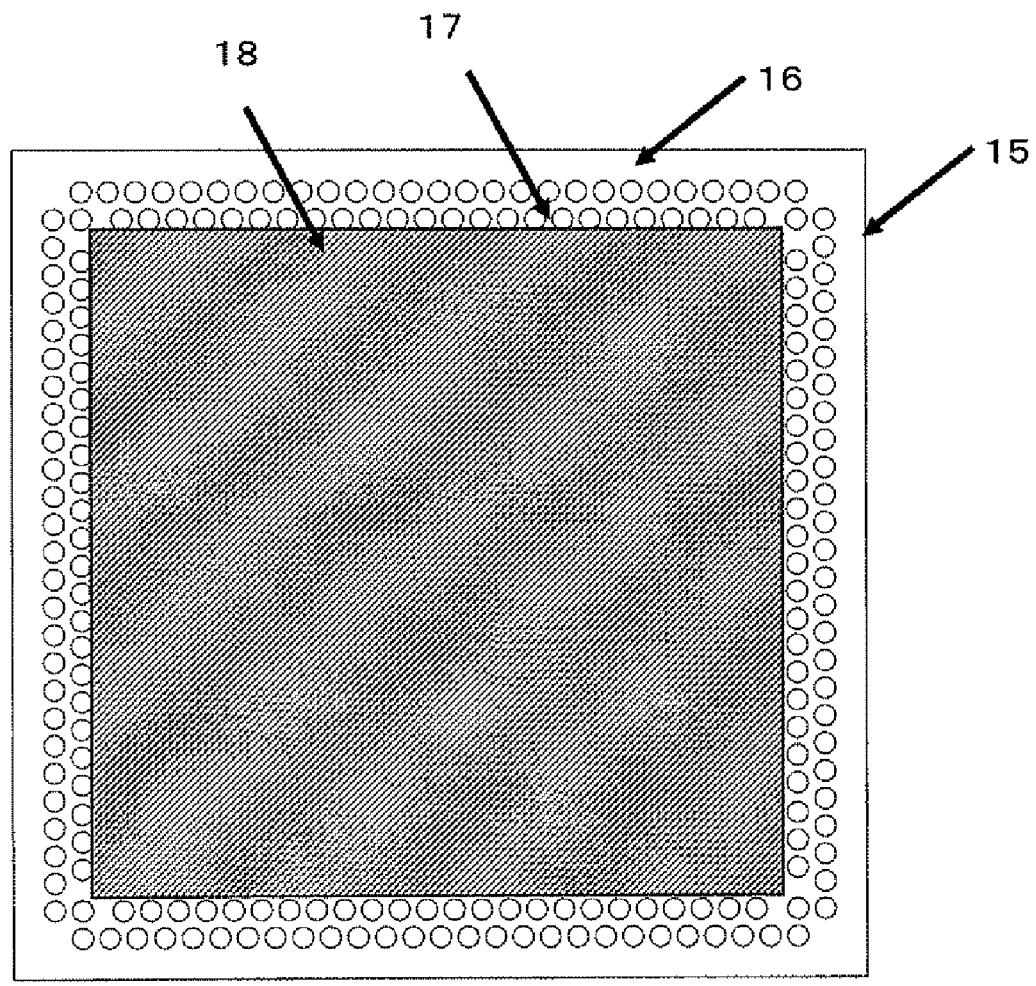
FIGS. 1A and 1B show the appearance of bump pads when a semiconductor integrated circuit is mounted onto a substrate.

Reference may now be made in detail to embodiments of the present invention, examples of which are illustrated in the accompanying drawings, wherein like reference numerals refer to like elements throughout.

Figure 1B:
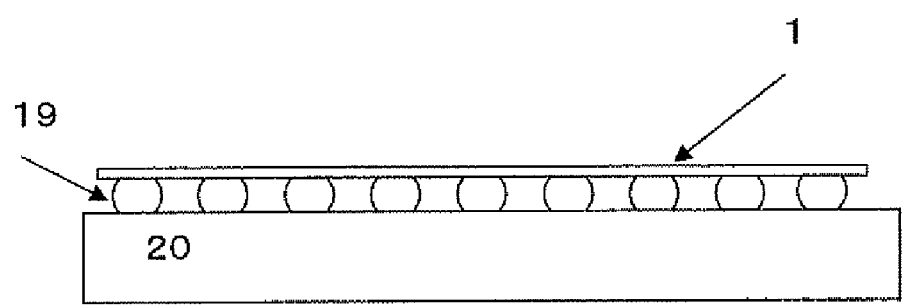

FIGS. 1A and 1B show the appearance of bump pads when a semiconductor integrated circuit is mounted onto a substrate.

A semiconductor integrated circuit is directly mounted onto a substrate in a flip chip mounting. Dummy bumps are necessary in a flip chip mounting to maintain connection strength. Circular bump pads are arranged on the rear face of a semiconductor integrated circuit 15 as shown in FIG. 1(a). The outer bump pads, which are signal bump pads, are connected to a circuit external to the semiconductor integrated circuit 15 by properly connecting signal lines to a signal bump pad 16. A bump pad is a dummy bump pad for mounting the semiconductor integrated circuit 15 onto the substrate other than the signal bump pads 16.

Further, dummy bump pads 18, which are located in a dummy bump pad area 17, are simply provided as bonding locations for solder bumps. The solder bumps are used for mounting onto the substrate without connecting to the signal lines. As shown in FIG. 1(b), solder bumps 19 are formed by putting small solder grains on a portion of dummy bump pads 18. The solder bumps are heated, the semiconductor integrated circuit 15 and a substrate 20 are pressed together, and then the solder bumps are cooled. Therefore, solder bumps 19 bonds the semiconductor integrated circuit 15 and the substrate 20 together. Solder bumps 19 are put on the substrate 20, and then bump pads are provided on the substrate to bond with the semiconductor integrated circuit 15.

FIGS. 2A, 2B, 2C, and 2D show an embodiment of the present device.

Figure 2A:
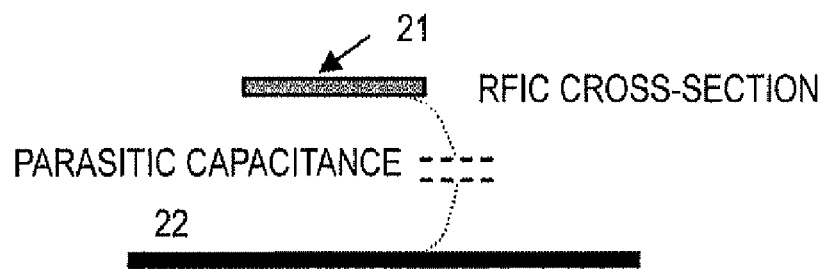
FIGS. 2A, 2B, 2C, and 2D show an embodiment of the present device.
Figure 2B:
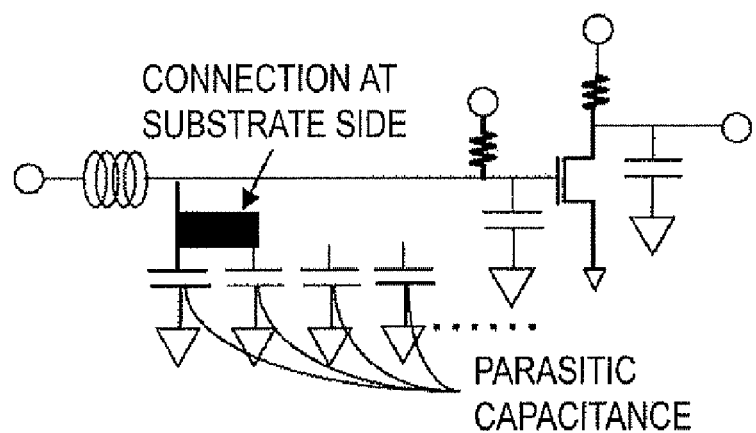
Figure 2C:
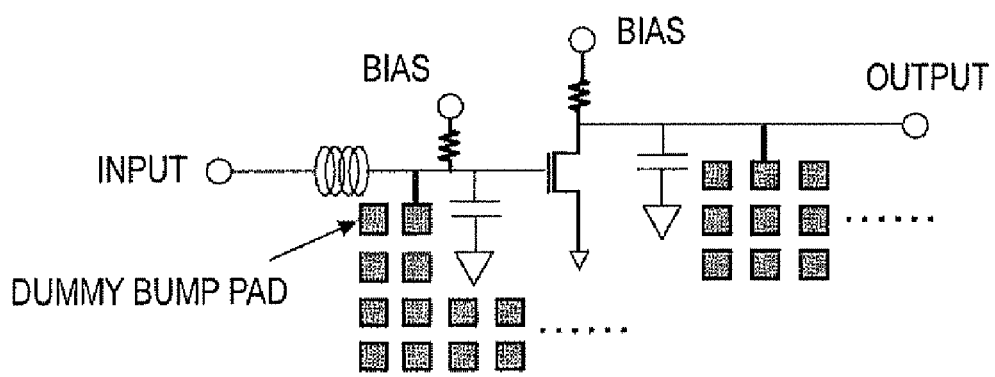
Figure 2D:
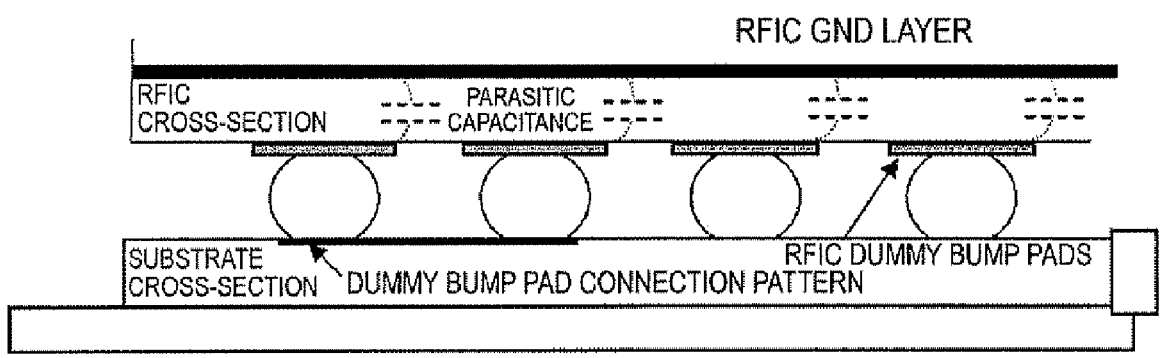

As shown in FIG. 2(a), parasitic capacitance exists between a GND layer 22 of a radio frequency integrated circuit (RFIC) and dummy bump pads 21 even though the dummy bump pads 21 are not connected to any wire of a typical semiconductor integrated circuit. In an embodiment of the present invention, the parasitic capacitance existing between the dummy bump pads and the GND layer of an RFIC is used as a capacitor for a matching circuit. As shown in the circuit connection diagram in FIG. 2 (b), multiple capacitors which are not connected to the circuit are formed if the parasitic capacitance of all of the dummy bump pads is treated as a capacitor. As shown in FIG. 2 (c), one dummy bump pad is connected to the portion of the RFIC circuit requiring a capacitor. As shown in FIG. 2 (d), a wire is required on the substrate and the dummy bump pads are connected to each other electrically.

The capacitance of capacitors which are connected to the circuit is determined by the number of dummy bump pads to be connected. The capacitance which is connected to the circuit can be changed and an RFIC circuit can be operated at the desired frequency band by changing the substrate according to operating frequency band if various methods of connecting dummy bump pads are used for multiple substrates and the RFIC circuit is bonded to a substrate.

Figure 3A:
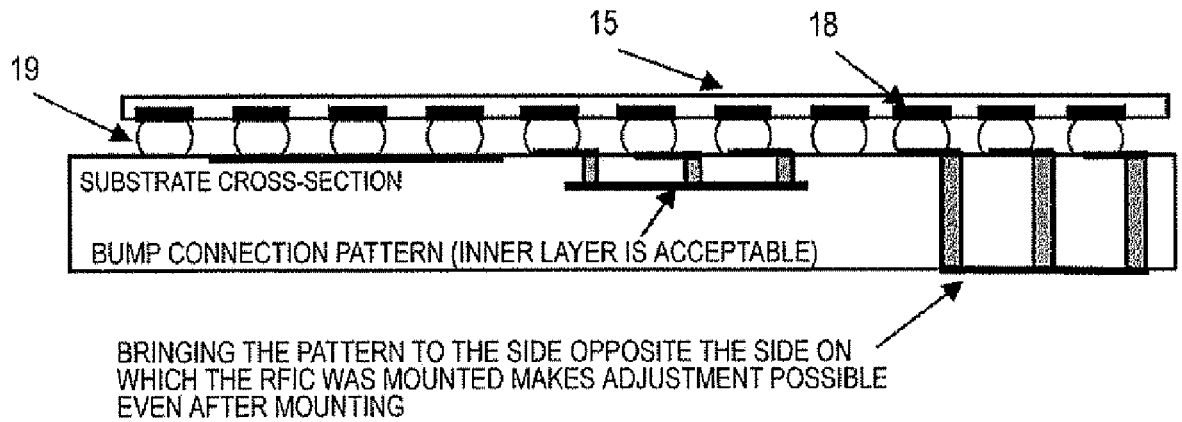
FIGS. 3A and 3B show one method of connecting dummy bump pads.
Figure 3B:
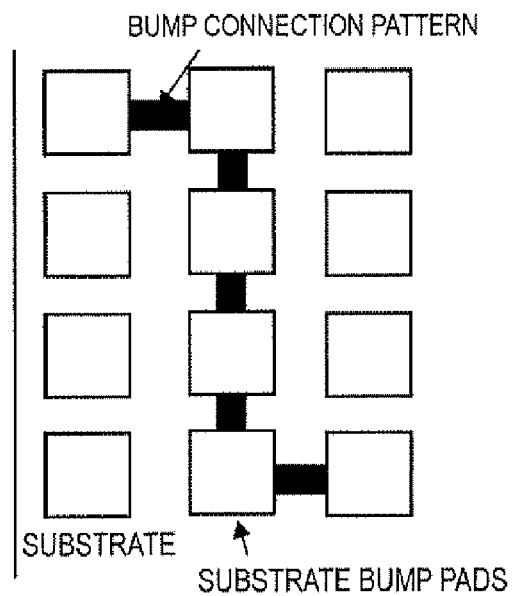

FIGS. 3A and 3B show an example method of connecting dummy bump pads.

Adjusting the frequency band being used is possible even after an RFIC is mounted by extending a connection pattern to the opposite side of the face on which the RFIC is mounted. The connection pattern is then connected to or disconnected from the substrate.

As shown in the cross-sectional view in FIG. 3 (a), while connecting dummy bump pads 18 in the RFIC 15 to the substrate by solder bumps 19, bump pads are provided in the portion of the substrate wherein solder bumps are placed, but all substrate bump pads are put initially in an unconnected state. Then, wires are extracted to the substrate interior (the substrate comprises multiple layers), or the opposite face by VIA holes or other means from bump pads on the substrate side. Then connections are made at the substrate side either between bump pads inside the substrate or at the opposite face of the substrate.

FIG. 3 (b) shows a typical connection state between bump pads at the substrate side. First all bump pads at the substrate side are connected to the opposite face of the substrate. The bump pads are matched to operating frequencies of the RFIC. The wires for the opposite face of the substrate are disconnected. Finally, only the necessary number of dummy bump pads 18 are connected to circuits inside the RFIC.

In another method for making connections, bump pads at the substrate side are left unconnected, an RFIC is mounted, and then the bump pads are connected at the opposite face of the substrate by wire or other means. The wire is extended from the bump pads at the substrate side. Nevertheless, making it possible to select the method of connecting the bump pads at the substrate side after an RFIC is mounted has the advantage of providing support with a single RFIC even when there are different operating frequency bands. Therefore, preparing a circuit for each frequency used is no longer necessary and reducing the circuit size becomes possible. Also, by using the dummy bumps which were used during mounting, the frequency band being used can be adjusted without adding exclusive adjustment pads or adjustment circuits.

As explained above, it can be made possible for the user to adjust the frequency band being used without the RFIC area being increased and without the RFIC being changed.

Figure 4:
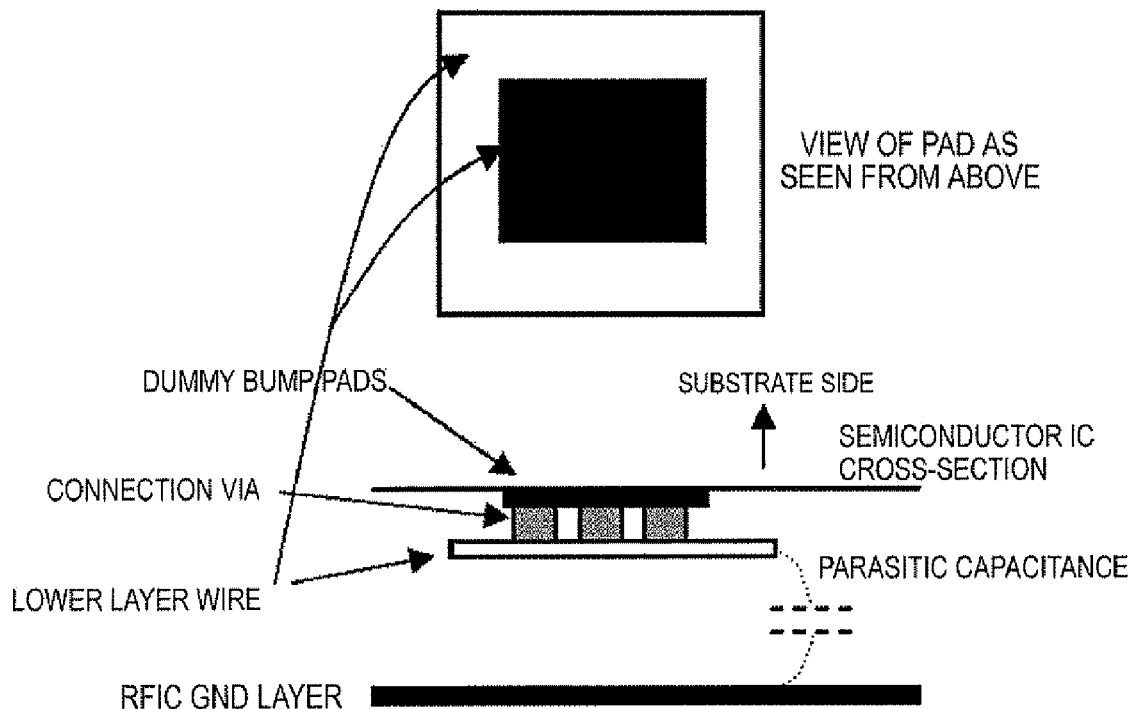
FIG. 4 shows one method of adjusting the parasitic capacitance of a portion of dummy bump pads (part 1).
Figure 5:
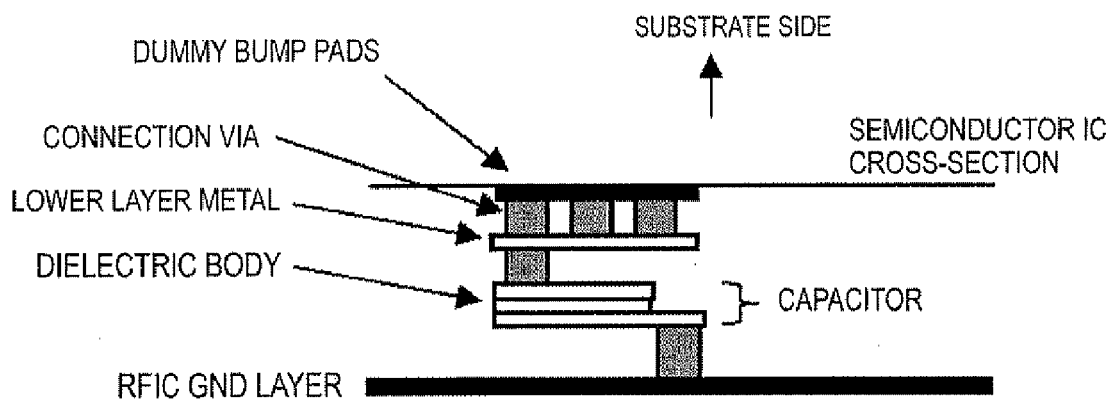
FIG. 5 shows one method of adjusting the parasitic capacitance of a portion of dummy bump pads (part 2).

FIG. 4 and FIG. 5 show a method of adjusting the parasitic capacitance of the dummy bump pad portion.

As shown in FIG. 4, the dummy bump pads protrude to the lower layer (surface of the semiconductor integrated circuit) of the dummy bump pads at the semiconductor integrated circuit side. As can be seen from the cross-sectional view of the semiconductor integrated circuit, however, wires exclusively used for adjusting parasitic capacitance inside the semiconductor integrated circuit are closer to the RFIC GND layer than the dummy bump pads. It is possible to adjust the amount of parasitic capacitance for a single dummy bump pad by changing the area of the metal surface which configures the amount of parasitic capacitance or the distance from the RFIC GND layer.

As is evident in FIG. 4, the area of the lower layer wires is greater than the area of the dummy bump pads, so the amount of parasitic capacitance for the dummy bump pad portion can be increased. The lower layer wires are exclusively used for adjusting the amount of parasitic capacitance, and are provided in portions inside the semiconductor integrated circuit where there are no other signal wires. The dummy bump pads and lower layer wires are connected by connection VIA or other means.

As shown in FIG. 5, the semiconductor integrated circuit can change the capacitance of the dummy bump pad portion by providing capacitors at the lower layer (inside the semiconductor integrated circuit) of the dummy bump pads at the semiconductor integrated circuit side. As shown in FIG. 5, a capacitor comprising dielectric bodies is interleaved by metal fragments within the cross-section of the semiconductor integrated circuit. Each metal fragment of this capacitor is connected to the RFIC GND layer and dummy bump pads by way of the connection VIA. In FIG. 5, the capacitor is directly connected to the RFIC GND layer by way of the connection VIA, but is also connected to a dummy bump pad through the lower layer metal. However, the capacitor can also be directly connected to the dummy bump pad by the connection VIA. In this way, the capacitance of the dummy bump portion is specified by the capacitance of capacitors more than it is specified by parasitic capacitance. Because capacitors are provided within the cross-section of the semiconductor integrated circuit, portions are selected in which elements such as signal wires or transistors of the semiconductor integrated circuit are not embedded, and then capacitors are provided in those portions.

Figure 6:
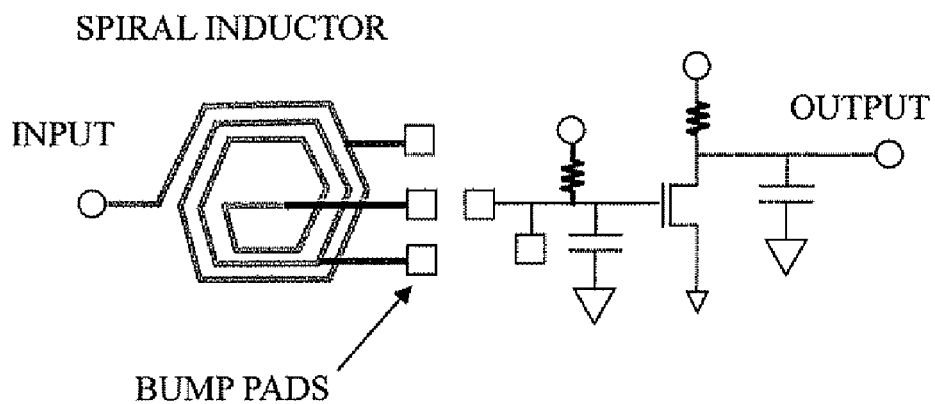
FIG. 6 shows a case when an inductor is connected from dummy bumps to a circuit (part 1).
Figure 7:
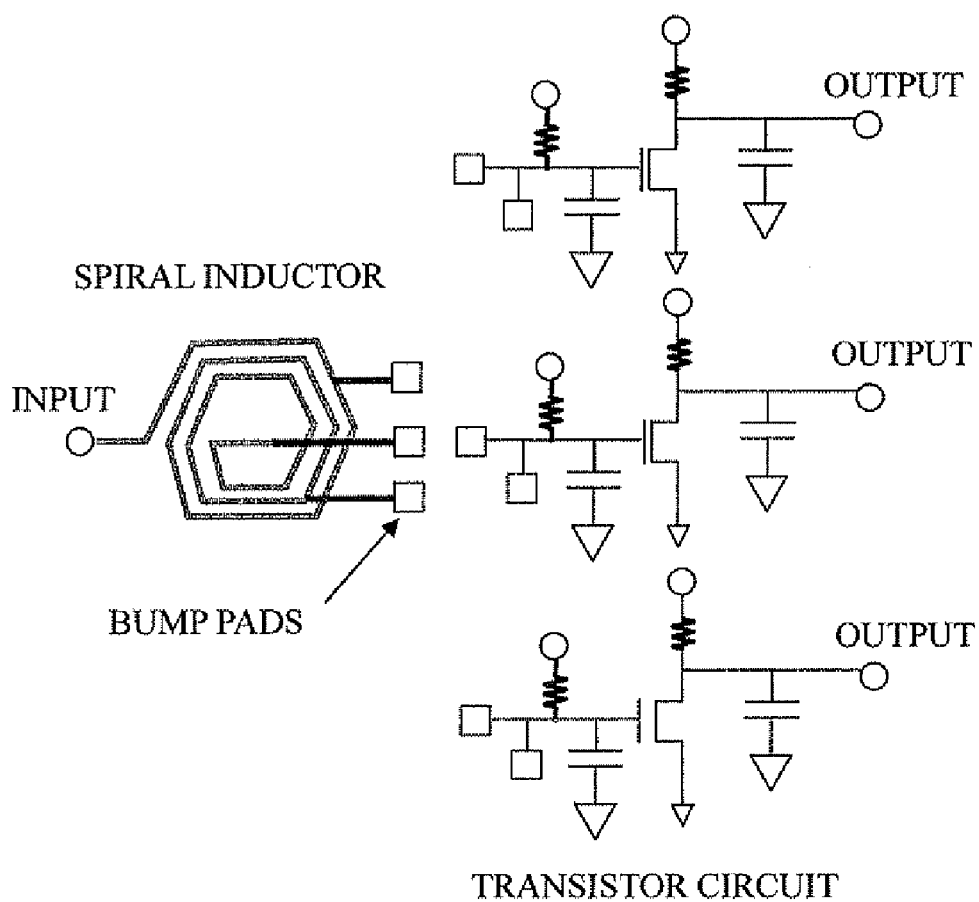
FIG. 7 shows a case when an inductor is connected from dummy bumps to a circuit (part 2).

FIG. 6 and FIG. 7 show a case when an inductor is connected from dummy bumps to a circuit.

As shown in FIG. 6, the semiconductor integrated circuit creates spiral inductors having multiple extraction positions. These extraction positions are connected to a dummy bump pad while wires which connect the inductors of the transistor circuit are connected to another dummy bump pad. Both dummy bump pads are connected at the substrate side. The amount of inductance which is obtained by the semiconductor integrated circuit, and the amount of capacitance, can be adjusted by selecting the extraction position and dummy bump pad count accordingly, thereby ultimately adjusting the operating frequency band of the transistor circuit.

Also, as shown in FIG. 7 the semiconductor integrated circuit provides multiple types of transistor circuits if requirement specifications such as gain differ according to the frequency band. A transistor circuit that matches the operating frequency band applied by the semiconductor integrated circuit is connected to the spiral inductor and used. The spiral inductor has multiple extraction positions, so the amount of the inductance can be adjusted by selecting one appropriate position of these extraction positions. Adjusting the capacitance of the capacitors and the connection of the dummy bump pad will also be sufficient.

Also, multiple inductors or capacitors do not have to be accepted in order to adjust the operating frequency band. Therefore, multiple inductors or capacitors having a large area are not specially provided on the semiconductor integrated circuit. The circuit area can be reduced by providing multiple transistor circuits with a small area and connecting the appropriate transistor circuits and inductors accordingly in order to share these inductors or capacitors.

The embodiment of the above present invention allows for the following. The operating frequency can be adjusted by changing the mounted substrate, so the user can adjust the operating frequency without changing the RFIC. The RFIC area can be reduced relative to when multiple high frequency circuits (matching circuits) are provided to match the operating frequency band. Because the dummy bumps actually needed for mounting are used, exclusive adjustment pads or circuits are not necessary, and the RFIC area is not increased. Implementing the embodiment of the present invention does not require any modifications to the RFIC such as changing the mask in the semiconductor process, changing the wire process, or changing the adjustment wire. No external components are required since the configuration was only made sufficient for connecting elements by substrate patterns.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor integrated circuit which is connected to a substrate comprising:
    a first pad connected to a signal line of said semiconductor integrated circuit;
    a plurality of second pads provided on the semiconductor integrated circuit and unconnected to the signal line; and
    a plurality of third pads provided on the substrate, unconnected to the signal line and connected to the plurality of second pads via a plurality of bumps provided between the semiconductor integrated circuit and the substrate,
    wherein at least two of the plurality of third pads are coupled to each other.

2. The semiconductor integrated circuit according to claim 1 wherein:
    wires at said substrate side change the number of connected third pads by disconnecting or connecting wires which are extracted to the face opposite the face at which said semiconductor integrated circuit was mounted, thereby configuring a desired connection pattern between said third pads.

3. The semiconductor integrated circuit according to claim 1 wherein:
    wires which are connected to the at least two of the plurality of third pads exist inside a multilayered structure of said semiconductor integrated circuit.

4. The semiconductor integrated circuit according to claim 1 wherein:
    capacitors which are connected to the at least two of the plurality of third pads exist inside the multilayered structure of said semiconductor integrated circuit.

5. The semiconductor integrated circuit according to claim 1, comprising
    inductors which are connected to the at least two of the plurality of third pads from multiple locations, and
    a transistor circuit connecting signal lines to dummy pads, wherein:
    the at least two of the plurality of third pads and dummy pads of said transistor circuit are connected at said substrate side in order to match an operating frequency band of said semiconductor integrated circuit.

6. The semiconductor integrated circuit according to claim 5 wherein:
    multiple transistor circuits matching a specification for a gain required by the operating frequency band are mounted in said semiconductor integrated circuit.

7. The semiconductor integrated circuit according to claim 1 wherein:
    a number of the plurality of third pads which are coupled to each other is adjusted after the semiconductor integrated circuit is mounted in the substrate.

8. A method of connecting a semiconductor integrated circuit to a substrate, comprising:
    mounting the semiconductor integrated circuit on the substrate;
    providing a plurality of bumps between the semiconductor integrated circuit and the substrate;
    connecting a first pad to a signal line of the semiconductor integrated circuit;
    providing a plurality of second pads on the semiconductor integrated circuit which are unconnected to the signal line;
    providing a plurality of third pads on the substrate which are unconnected to the signal line;
    connecting the plurality of third pads to the plurality of second pads via the plurality of bumps; and
    connecting at least two of the plurality of third pads to each other.

9. A semiconductor integrated circuit which is connected to a substrate, comprising:
    a connection pad connected to a signal line of said semiconductor integrated circuit;
    a plurality of first dummy pads provided on the semiconductor integrated circuit, unconnected to the signal line and connected to a plurality of second dummy pads, which are provided on the substrate and are unconnected to the signal line via a plurality of bumps provided between the semiconductor integrated circuit and the substrate; and a substrate interconnection connected to at least two of the plurality of second dummy pads.

* * * * *